United States Patent
Fang et al.

(10) Patent No.: US 8,878,591 B2
(45) Date of Patent: Nov. 4, 2014

(54) LEVEL SHIFTER UTILIZING BIDIRECTIONAL SIGNALING THROUGH A CAPACITIVE ISOLATION BARRIER

(71) Applicant: International Rectifier Corporation, El Segundo, CA (US)

(72) Inventors: Min Fang, Manhattan Beach, CA (US); Massimo Grasso, Trivolzio (IT); Niraj Ranjan, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/934,546

(22) Filed: Jul. 3, 2013

(65) Prior Publication Data

US 2014/0028369 A1   Jan. 30, 2014

Related U.S. Application Data

(60) Provisional application No. 61/675,932, filed on Jul. 26, 2012.

(51) Int. Cl.
*H03L 5/00* (2006.01)
*H03K 19/0175* (2006.01)

(52) U.S. Cl.
CPC ......... *H03K 19/01759* (2013.01); *H03L 5/00* (2013.01)

USPC ............................... 327/333; 326/62; 326/81

(58) Field of Classification Search
USPC .................. 326/62–63, 80–81; 327/306, 333
See application file for complete search history.

(56) References Cited

U.S. PATENT DOCUMENTS

| 7,031,458 | B2 | 4/2006 | Holcombe | |
|---|---|---|---|---|
| 7,515,672 | B2 | 4/2009 | Dupuis | |
| 8,024,623 | B2 * | 9/2011 | Ho et al. | 714/700 |
| 8,228,976 | B2 | 7/2012 | Hsiao | |
| 8,373,486 | B2 * | 2/2013 | Ficke et al. | 327/333 |
| 8,571,093 | B1 * | 10/2013 | Van de Beek | 375/219 |

* cited by examiner

*Primary Examiner* — Dinh Le
(74) *Attorney, Agent, or Firm* — Farjami & Farjami LLP

(57) ABSTRACT

According to an exemplary implementation, a level shifter includes a low voltage circuit and a high voltage circuit. The low voltage circuit is configured to provide a differential signal to the high voltage circuit through a capacitive isolation barrier. The high voltage circuit is configured to receive the differential signal from the low voltage circuit through the capacitive isolation barrier so as to level shift the differential signal from a first ground of the low voltage circuit to a second ground of the high voltage circuit. The high voltage circuit is further configured to provide a feedback signal to the low voltage circuit through the capacitive isolation barrier. The low voltage circuit can be configured to receive the feedback signal from the low voltage circuit between edges of the differential signal.

20 Claims, 6 Drawing Sheets

LEVEL SHIFTER UTILIZING BIDIRECTIONAL SIGNALING THROUGH A CAPACITIVE ISOLATION BARRIER

BACKGROUND

The present application claims the benefit of and priority to a pending provisional application entitled "Asynchronous Common Mode Noise Immune Galvanic Isolated Signal Level Shifting," Ser. No. 61/675,932 filed on Jul. 26, 2012. The disclosure in this pending provisional application is hereby incorporated fully by reference into the present application.

Level shifters can be utilized to level shift a signal between circuits that are referenced to different grounds. One or more isolation barriers can provide galvanic isolation between the circuits. Exemplary approaches to galvanic isolation can be based on capacitance, induction, electromagnetic waves, and optical, acoustic, and mechanical means to exchange energy between the circuits. In some instances it may be desirable for the signal to be generated based on a feedback signal. Furthermore, it may be desirable to level shift the feedback signal. A dedicated level shifter and isolation barrier may be utilized for the feedback signal.

SUMMARY

A level shifter utilizing bidirectional signaling through a capacitive isolation barrier, substantially as shown in and/or described in connection with at least one of the figures, and as set forth more completely in the claims.

DETAILED DESCRIPTION

Figure 1:
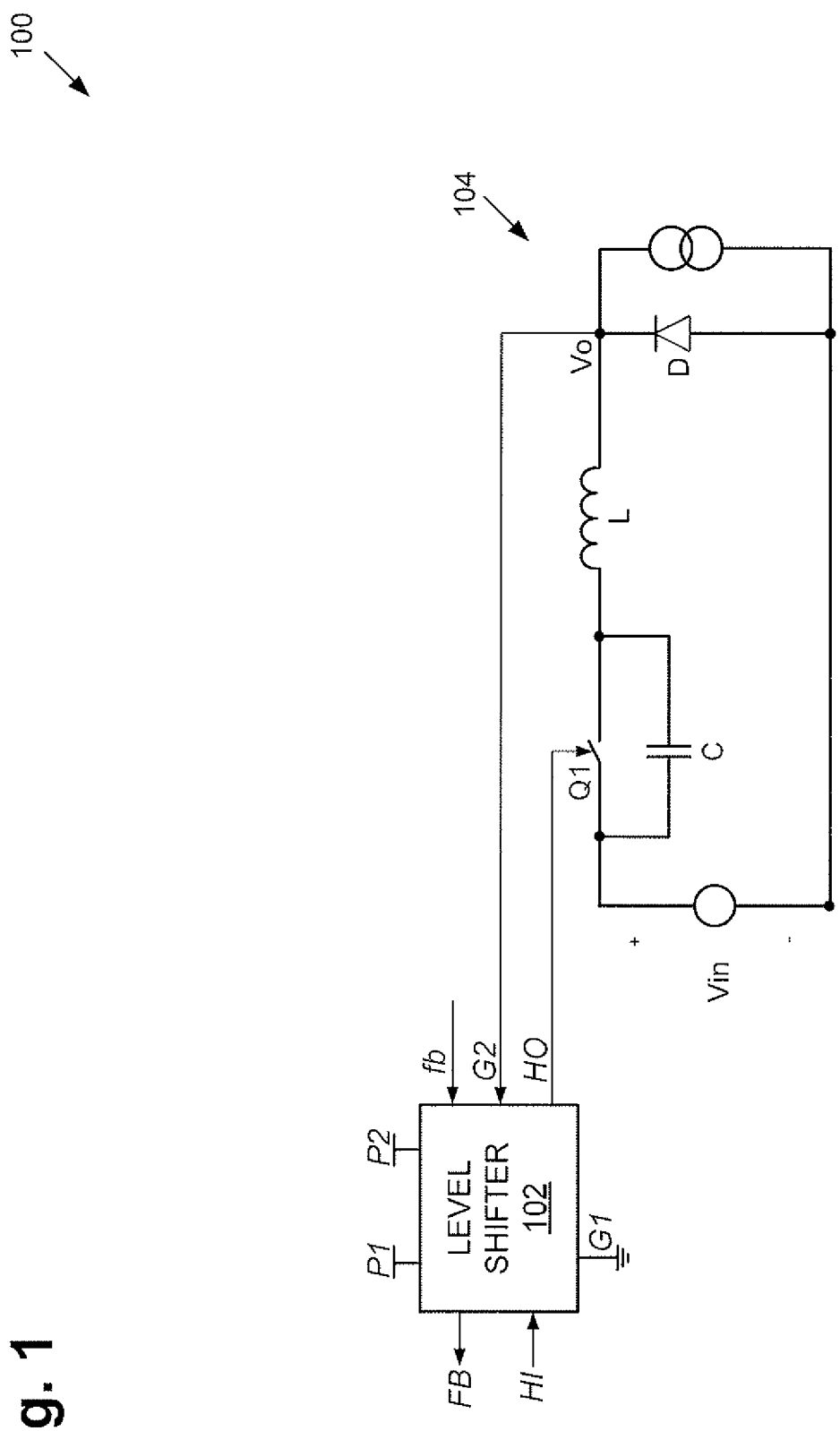
FIG. 1 presents an exemplary system including a level shifter, in accordance with implementations of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents an exemplary system including a level shifter, in accordance with implementations of the present disclosure. As shown in FIG. 1, system 100 includes level shifter 102 and power supply 104. Power supply 104 is a switched mode power supply including input voltage Vin, capacitor C, inductor L, diode D, and power switch Q1.

Level shifter 102 is configured to level shift input signal HI to output signal HO. Output signal HO is referenced to a different ground than input signal HI, such that output signal HO is suitable for driving power switch Q1. As shown in FIG. 1, input signal HI corresponds to a control signal for power switch Q1 of power supply 104, which is level shifted to output signal HO so as to properly control power switch Q1.

In system 100, input signal HI and output voltage Vo can be, for example, thousands of volts apart. As such, level shifter 102 can be at substantial risk for exposure to noise, which can interfere with the accuracy of level shifter 102. For example, high voltage switching in power supply 104 can introduce common mode noise in level shifter 102. Certain common mode noise in system 100 can be synchronous common mode noise that coincides with input signal HI switching power switch Q1 (or multiple power switches and/or multiple input signals in other power supply topologies). However, other common mode noise in system 100 can be asynchronous common mode noise that does not necessarily coincide with input signal HI switching power switch Q1.

By way of more specific example, asynchronous common mode noise in system 100 may occur in zero voltage switching during OFF time of power switch Q1. During this time, an LC tank formed by capacitor C and inductor L can resonate, and reactivate power switch Q1 causing asynchronous common mode noise. As another example, power supply 104 may include a half-bridge for switching power (e.g. comprising microelectromechanical systems (MEMS) switches) in, for example, a plasma display panel (PDP). In this example, asynchronous common mode noise may result from switching of auxiliary switches that are coupled to the half-bridge.

It should be noted that system 100 includes power supply 104 as an example, which may instead correspond to another circuit receiving output signal HO. Thus, power supply 104 could instead be a circuit that is not a power supply and may more generally correspond to a circuit receiving output signal HO from level shifter 102.

Common mode noise in system 100 can interfere with the ability of level shifter 102 to accurately level shift input signal HI to output signal HO resulting in distortion in output signal HO. The distortion can cause misfire of power switch Q1 or other circuitry being controlled utilizing output signal HO. As such, common mode noise in system 100, and especially asynchronous common mode noise, can cause disruption, loss of functionality, and damage to system 100.

System 100 also includes feedback signal FB, where output signal HO can be provided based on feedback signal FB. Feedback signal FB can be from level shifter 102 and/or power supply 104 (or a different circuit receiving output signal HO). As shown in FIG. 1, in some implementations, level shifter 102 optionally includes feedback input fb, which can be from power supply 104. Feedback signal FB can be from feedback input fb, but may additionally or instead be from within level shifter 102. Furthermore, feedback signal FB may be utilized within level shifter 102, but may additionally or instead be used external to level shifter 102. As such, in some implementations, level shifter 102 is configured to provide feedback signal FB as an output as shown in FIG. 1.

Level shifter 102 can thereby be configured to provide feedback signal FB to a microcontroller (not shown) or other circuitry. The microcontroller or other circuitry can generate input signal HI based on feedback signal FB.

Feedback signal FB may be from feedback referenced to ground G2. However, it may be desirable for feedback signal FB to be referenced to a different ground, such as ground G1. By providing for feedback signal FB in level shifter 102, system 100 can be fabricated at low cost and have a lower footprint, amongst other advantages.

Figure 2:
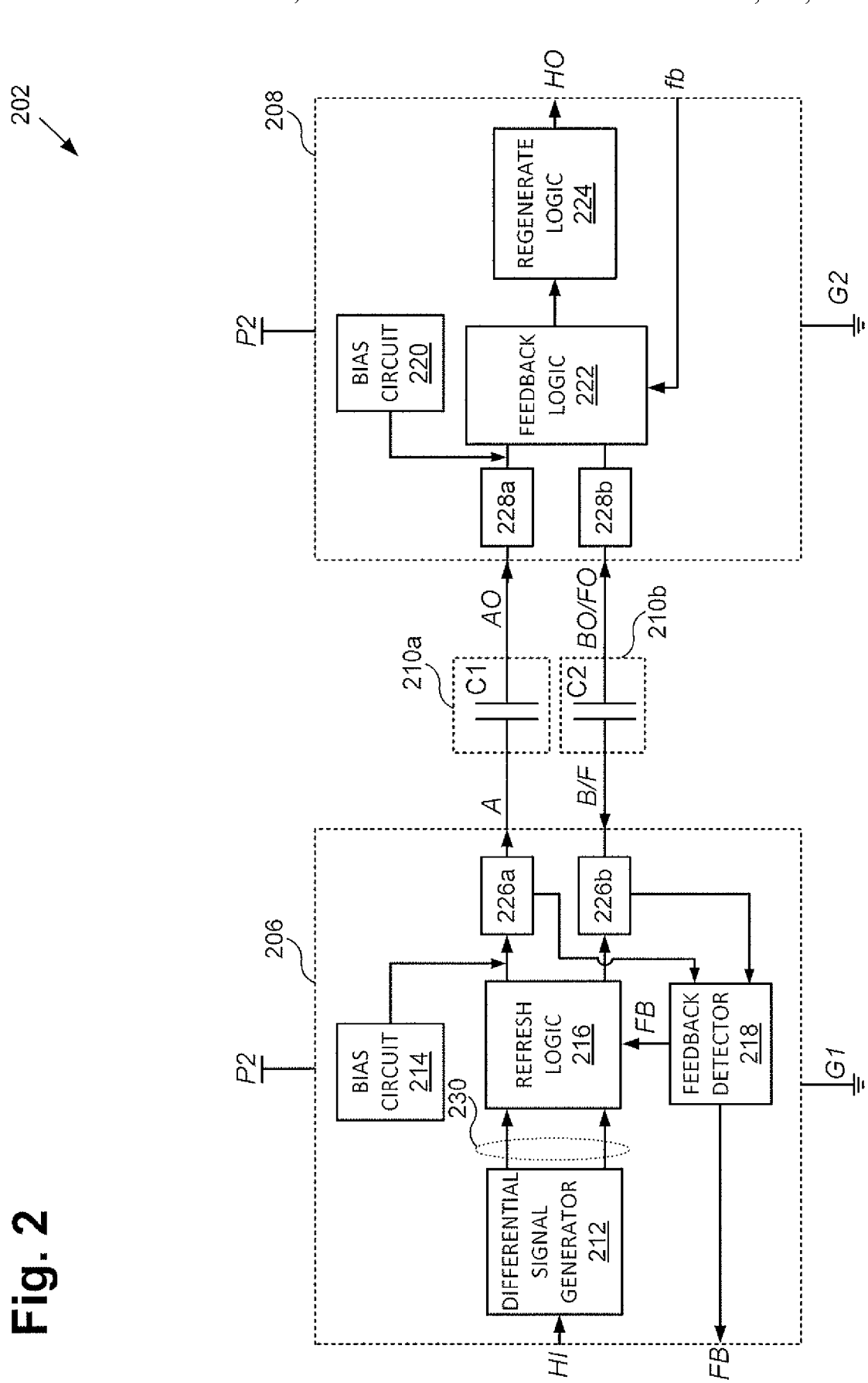
FIG. 2 presents a diagram of an exemplary level shifter, in accordance with implementations of the present disclosure.

Referring now to FIG. 2, FIG. 2 presents a diagram of an exemplary level shifter, in accordance with implementations of the present disclosure. In FIG. 2, level shifter 202 corresponds to level shifter 102 in FIG. 1. Level shifter 202 includes low voltage circuit 206, high voltage circuit 208, and isolation barriers 210a and 210b.

Low voltage circuit 206 includes differential signal generator 212, bias circuit 214, refresh logic 216, feedback detector 218, and variable impedance drivers 226a and 226b. High voltage circuit 208 includes bias circuit 220, feedback logic 222, regenerate logic 224, and variable impedance drivers 228a and 228b. Isolation barrier 210a includes at least one capacitor C1 and isolation barrier 210b includes at least one capacitor C2.

In level shifter 202, low voltage circuit 206 is coupled to power P1 and is referenced to ground G1. High voltage circuit 208 is coupled to power P2 and is referenced to ground G2, which can be a floating ground. Low voltage circuit 206 is configured to provide differential signal 230 to high voltage circuit 208. As shown in FIG. 2, differential signal generator 212 receives input signal HI and generates differential signal 230 from input signal HI. Refresh logic 216 provides differential signal 230 to isolation barriers 210a and 210b as complementary signals A and B utilizing bias circuit 214, feedback detector 218, and variable impedance drivers 226a and 226b.

High voltage circuit 208 is configured to receive differential signal 230 from low voltage circuit 206 so as to level shift differential signal 230 from ground G1 of low voltage circuit 206 to ground G2 of high voltage circuit 208. As shown in FIG. 2, isolation barriers 210a and 210b galvanically isolate low voltage circuit 206 from high voltage circuit 208 in converting complementary signals A and B to complementary signals AO and BO utilizing bias circuit 220.

In FIG. 2, high voltage circuit 208 is configured to provide feedback signal FB to low voltage circuit 206 through isolation barrier 210a and/or 210b. Thus, isolation barrier 210a and/or 210b can be utilized for bidirectional signaling in level shifter 202. For example, in the implementation shown, isolation barrier 210b galvanically isolates low voltage circuit 206 from high voltage circuit 208 in converting feedback FO to feedback F. By utilizing bidirectional signaling, level shifter 202 can avoid a dedicated isolation barrier for feedback signal FB. Avoiding the dedicated isolation barrier can substantially lower cost as well as the footprint of level shifter 202, amongst other advantages.

In some implementations, differential signal 230 is provided by low voltage circuit 206 responsive to feedback signal FB from high voltage circuit 208. As such, low voltage circuit 206 can adjust complementary signals A and B based on feedback signal FB. Additionally or instead, input signal HI can be provided responsive to feedback signal FR As shown in FIG. 2, level shifter 202 provides feedback signal FB as an output. Thus, a mircocontroller and/or other external circuitry can receive feedback signal FB. Furthermore, the microcontroller and/or other external circuitry can provide input signal HI to level shifter 202 based on feedback signal FB.

In various implementations, feedback signal FB may indicate any combination of common mode noise, over current, over temperate, and/or over voltage conditions of high voltage circuit 208 and/or power supply 204. Feedback logic 222 in high voltage circuit 208 can be configured to detect feedback from feedback input fb. Thus, high voltage circuit 208 can be configured to provide feedback signal FB to low voltage circuit 206 from an input of high voltage circuit 208. However, feedback logic 222 may instead or in addition be configured to detect feedback from within level shifter 202. For example, feedback logic 222 in high voltage circuit 208 can include a feedback generator for providing feedback signal FB to low voltage circuit 206.

FIGS. 3A, 3B, 3C, and 3D illustrate exemplary level shifters having at least one shared isolation barrier, which can be utilized for bidirectional signaling. Referring to FIGS. 3A, 3B, 3C, and 3D, FIGS. 3A, 3B, 3C, and 3D present diagrams of level shifters having exemplary low and high voltage integrated circuits, in accordance with implementations of the present disclosure.

In FIGS. 3A, 3B, 3C, and 3D, respective level shifters 302a, 302b, 302c, 302d correspond to level shifter 202 in FIG. 2. Level shifters 302a, 302b, 302c, and 302d include low voltage circuit 306 corresponding to low voltage circuit 206 in FIG. 2 and high voltage circuit 308 corresponding to high voltage circuit 208 in FIG. 2. Also in FIGS. 3A, 3B, 3C, and 3D, isolation barriers 310a and 310b correspond respectively to isolation barriers 210a and 210b in FIG. 2.

In FIGS. 3A, 3B, 3C, and 3D, low voltage circuit 306 is on low voltage integrated circuit (IC) 336 and high voltage circuit 308 is on high voltage IC 338. Low voltage IC is coupled between power P1 and ground G1 and high voltage IC is coupled between power P2 and ground G2. Isolation barriers 310a and 310b can be formed in various metal levels of low and high voltage ICs 336 and 338.

FIGS. 3A, 3B, 3C, and 3D illustrate exemplary configurations that may be utilized for isolation barriers in level shifters in accordance with implementations of the present disclosure. In the implementations shown, the isolation barriers are capacitive isolation barriers. Various approaches may be employed so as to achieve proper capacitance for the isolation barriers.

Figure 3A:
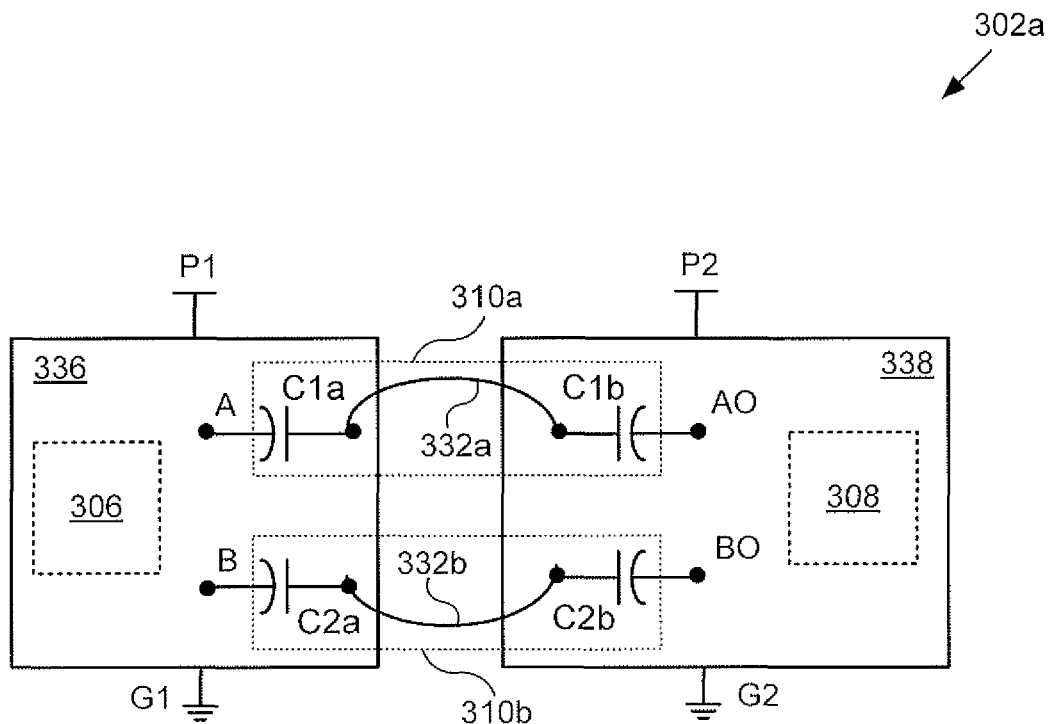
FIG. 3A presents a diagram of a level shifter having exemplary low and high voltage integrated circuits, in accordance with implementations of the present disclosure.

In FIG. 3A, isolation barrier 310a includes capacitors C1a and C1b corresponding to capacitor C1 in FIG. 2 and isolation barrier 310b includes capacitors C2a and C2b corresponding to capacitor C2 in FIG. 2. Capacitors C1a and C2a are on low voltage IC 336 and capacitors C1b and C2b are on high voltage IC 338. Splitting up isolation barriers 310a and 310 by including capacitors in series can simplify manufacturing of isolation barriers 310a and 310b. As shown in FIG. 3A, capacitors C1a and C1b can be coupled to one another utilizing one or more wirebonds 332a and capacitors C2a and C2b can be coupled to one another utilizing one or more wirebonds 332b.

Figure 3B:
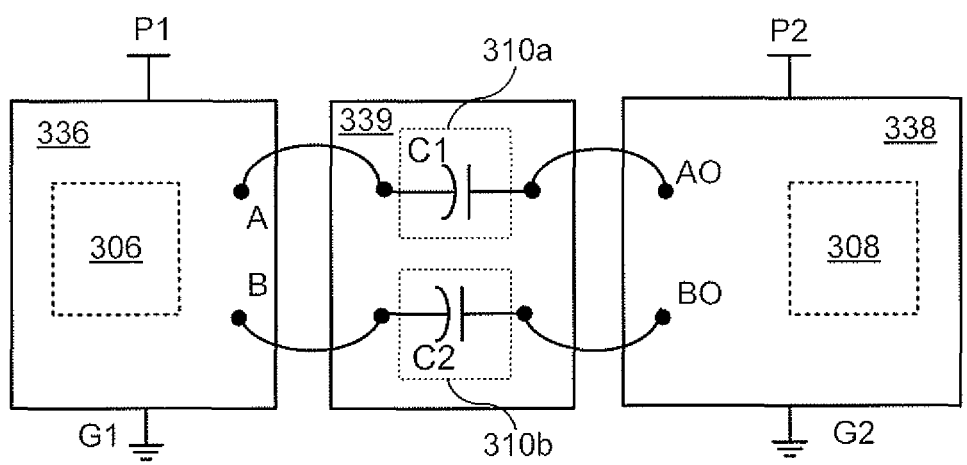
FIG. 3B presents a diagram of a level shifter having exemplary low and high voltage integrated circuits and an isolation barrier integrated circuit, in accordance with implementations of the present disclosure.

In some implementations, isolation barriers 310a and 310b are at least partially on isolation barrier IC 339. Isolation barriers 310a and 310b can be completely on isolation barrier IC 339, as shown in FIG. 3B, or may be distributed across isolation barrier IC 339 and any of low and high voltage ICs 336 and 338. As in FIG. 3A, various wirebonds may be utilized to couple isolation barrier IC 339 and low and high voltage ICs 336 and 338 as shown.

Figure 3C:
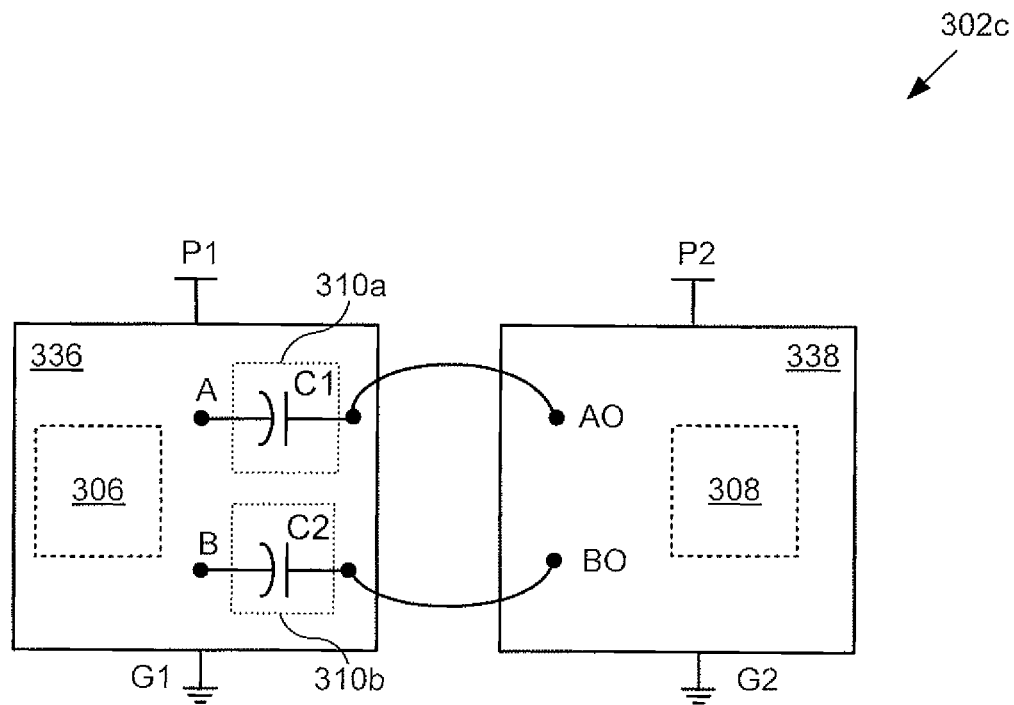
FIG. 3C presents a diagram of a level shifter having exemplary low and high voltage integrated circuits, in accordance with implementations of the present disclosure.
Figure 3D:
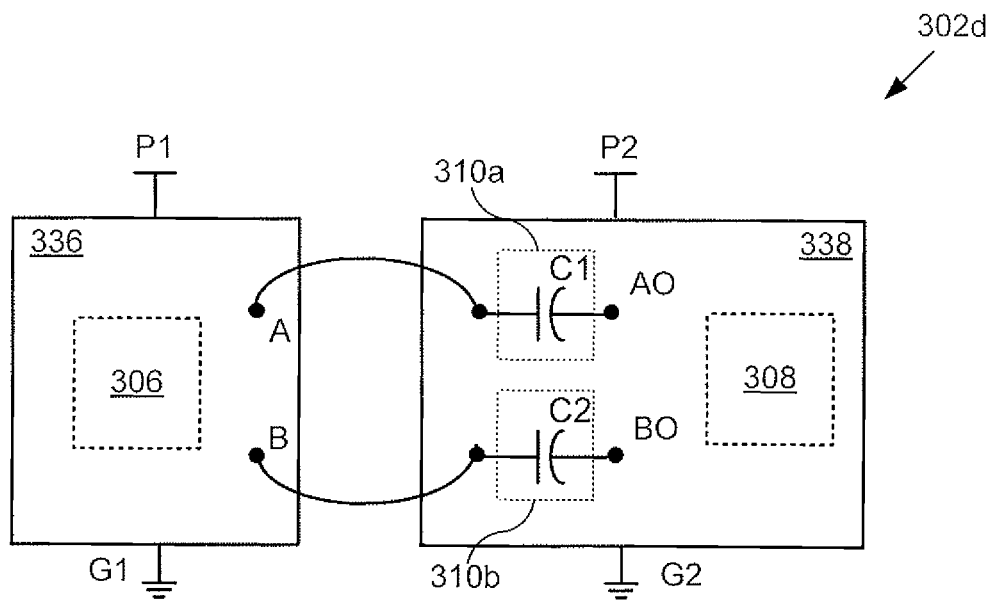
FIG. 3D presents a diagram of a level shifter having exemplary low and high voltage integrated circuits, in accordance with implementations of the present disclosure.

Alternatively, isolation barriers 310a and 310b can be completely on either of low and high voltage ICs 336 and 338. For example, in FIG. 3C, isolation barriers 310a and 310b are completely on low voltage IC 336. In FIG. 3D, isolation barriers 310a and 310b are completely on high voltage IC 338. In other implementations, one of isolation barriers 310a and 310b is completely on low voltage IC 336 and the other of isolation barriers 310a and 310b is completely on high voltage IC 338.

Figure 4:
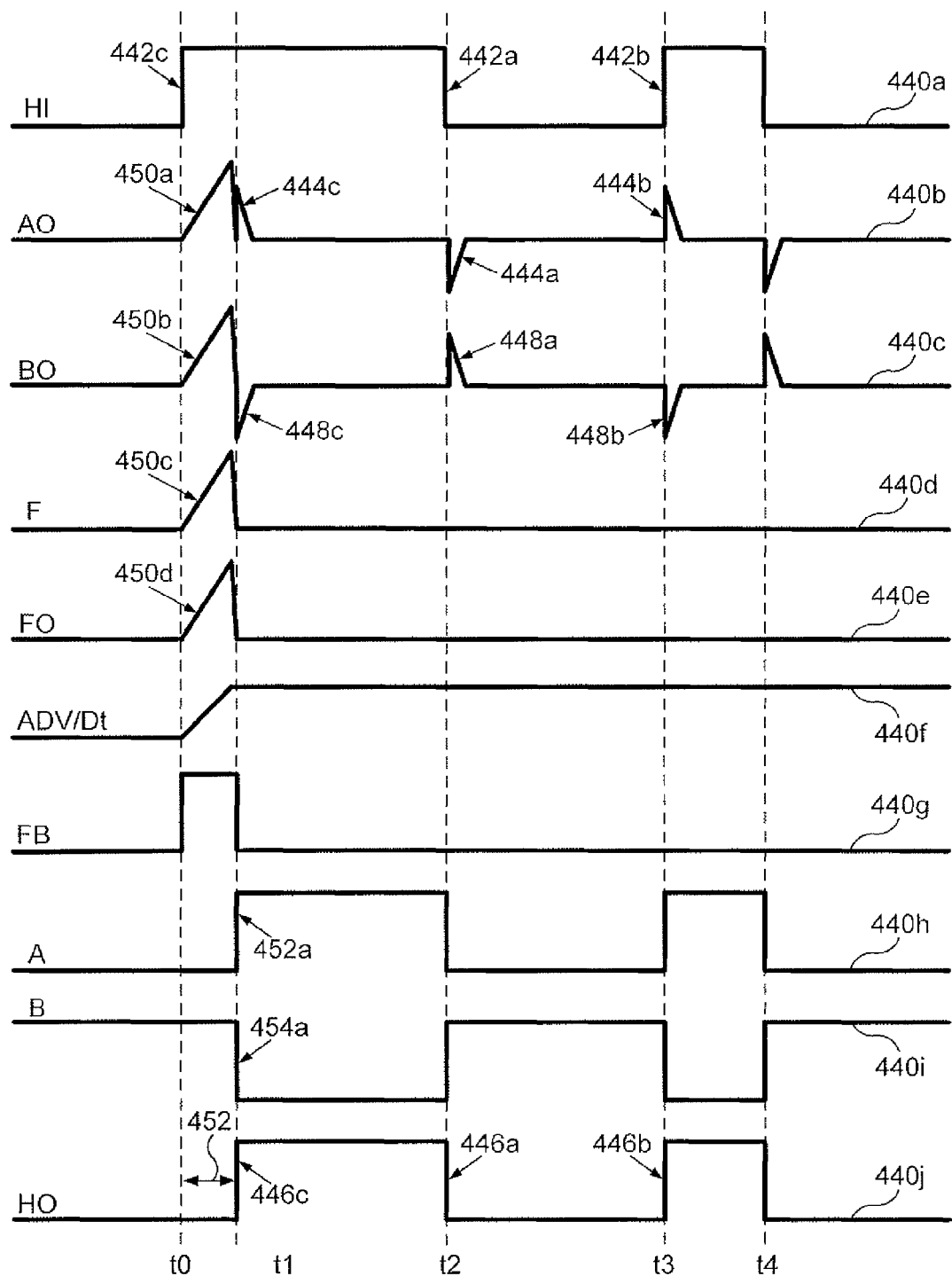
FIG. 4 presents exemplary waveforms of a system having a level shifter, in accordance with implementations of the present disclosure.

FIG. 4 presents exemplary waveforms of a system having a level shifter, in accordance with implementations of the present disclosure. In FIG. 4, waveforms 440a, 440b, 440c, 440d, 440e, 440f, 440g, 440h, 440i, and 440j correspond to waveforms of similarly labeled elements in FIG. 2.

Referring to FIGS. 1 and 2 with FIG. 4, as described above, common mode noise in system 100, and especially asynchronous common mode noise, can cause disruption, loss of functionality, and damage to system 100. FIG. 4 shows that level shifter 202 is level shifting input signal HI to output signal HO concurrently with asynchronous common mode noise ADV/Dt between times t0 and t1. Between times t1 and t4, level shifter 102 is level shifting input signal HI to output signal HO, but the influence of asynchronous common mode noise ADV/Dt has subsided.

Absent asynchronous common mode noise ADV/Dt, each edge of input signal HI is manifested as input signal spikes in complimentary signals AO and BO. As shown in FIG. 4, between times t2 and t4, complimentary signals A and B correspond to a differentiated version of input signal HI. Thus, falling edge 442a in waveform 440a is manifested as downward input signal spike 444a in waveform 440b and upward input signal spike 448a (also referred to as input signal spike 448a) in waveform 440c. Furthermore, rising edge 442b in waveform 440a is manifested as upward input signal spike 444b in waveform 440b and downward input signal spike 448b (also referred to as input signal spike 448b) in waveform 440b. Waveforms 440b and 440c have input signal spikes with opposing polarities due to the differential nature of complimentary signals A and B.

In high voltage circuit 208, regenerate logic 224 is configured to generate output signal HO where edges of output signal HO correspond substantially to the input signal spikes in waveforms 440b and 440c. As such, waveform 440j includes falling edge 446a corresponding to downward input signal spike 444a in waveform 440b and rising edge 446b corresponding to upward input signal spike 444b in waveform 440b. In doing so, output signal HO accurately corresponds to a level shifted version input signal HI while low and high voltage circuits 206 and 208 are galvanically isolated.

In level shifter 202, asynchronous common mode noise ADV/Dt and common mode noise in general is manifested as noise spikes having a common polarity in waveforms 440b, 440c, 440d, and 440e due to being each referenced to ground G2. For example, FIG. 4 shows common mode noise spikes 450a, 450b, 450c, and 450d having a common polarity. As corresponding input signal spikes in waveforms 440b and 440c have opposing polarities (e.g. downward input signal spike 444a and upward input signal spike 448a), in some implementations, high voltage circuit 208 is configured to detect common mode noise spikes 450a and 450b as not being part of input signal HI based on common mode noise spikes 450a and 450b having a common polarity (negative or positive). As such, regenerate logic 224 may be configured to reject common mode noise by holding the state of output signal HO based on detecting common mode noise spikes 450a and 450b.

The aforementioned scheme of common mode noise detection may be suitable in many instances where common mode noise spikes in level shifter 202 are caused by synchronous common mode noise. However, in FIG. 4, common mode noise spikes 450a and 450b are caused by asynchronous common mode noise ADV/Dt. Thus, common mode noise spikes in level shifter 202 can occur in times substantially concurrent with edges of input signal HI. Such an occurrence is illustrated in FIG. 4 where common mode noise spikes 450a and 450b are swamping out edge 442c from waveforms 440b and 440c. As such, regenerate logic 224 may only detect asynchronous common mode noise ADV/Dt resulting in distortion 452 in output signal HO. As shown in FIG. 4, waveform 440j remains low at time t0, whereas waveform 440a has edge 442c to transition high.

In level shifter 202, distortion in output signal HO can cause disruption, loss of functionality, and damage to system 100 of FIG. 1. Low voltage circuit 206 is configured to refresh differential signal 230 responsive to feedback signal FB. By refreshing differential signal 230, distortion 452 in waveform 440j is significantly reduced.

In level shifter 202, feedback signal FB is provided by feedback logic 222 of high voltage circuit 208 concurrently with common mode noise in level shifter 202. As shown in FIG. 4, level shifter 202 is configured such that asynchronous common mode noise ADV/Dt is manifested in waveforms 440d and 440e as common mode noise spikes 450c and 450d. Feedback detector 218 of low voltage circuit 206 is configured to detect feedback signal FB from common mode noise spike 450d. Thus, low voltage circuit 206 is configured to detect common mode noise in level shifter 202. Refresh logic 216 receives feedback signal FB and is configured to refresh differential signal 230 responsive to feedback signal FB. Thus, at time t1, waveforms 440h and 440i include respective input signal refresh edges 452a and 454a, which are refreshed versions of edge 442c of input signal HI. Input signal refresh edges 452a and 454a are manifested as input signal refresh spikes 444c and 448c in respective waveforms 440b and 440c. As such, regenerate logic 224 of high voltage circuit 208 can detect input signal refresh spikes 444c and 448c so as to generate edge 446c in output signal HO to end distortion 452 at time t1 rather than time t2.

Thus, in level shifter 202, feedback signal FB is provided by high voltage circuit 208 through isolation barrier 210b. However, feedback signal FB may instead or in addition be provided by high voltage circuit 208 through isolation barrier 210a. By receiving feedback signal FB, low voltage circuit 206 can optionally provide differential signal 230 responsive to feedback signal FB from high voltage circuit 208 while being galvanically isolated therefrom. Furthermore, as low voltage circuit 206 is configured to provide feedback signal FB as an output of level shifter 202, a microcontroller or and/or other external circuitry can optionally provide input signal HI to level shifter 202 based on feedback signal FB. The implementation described above emphasizes where feedback signal FB indicates common mode noise in level shifter 202. However, as described above, in various implementations, feedback signal FB may indicate any combination of common mode noise, over current, over temperate, and/or over voltage conditions of high voltage circuit 208 and/or power supply 204.

Thus, isolation barrier 210a and/or 210b can be utilized for bidirectional signaling in level shifter 202. By utilizing bidirectional signaling, level shifter 202 can avoid a dedicated isolation barrier for feedback signal FB. Avoiding the dedicated isolation barrier can substantially lower cost as well as the footprint of level shifter 202, amongst other advantages. In some implementations, bidirectional signaling is provided for utilizing variable impedance drivers 226a, 226b, 228a, and 228b. Also, only one of isolation barriers 210a and 210b may be utilized for bidirectional signaling. As such, corresponding ones of variable impedance drivers 226a, 226b, 228a, and 228b may not be included in those implementations.

Figure 5:
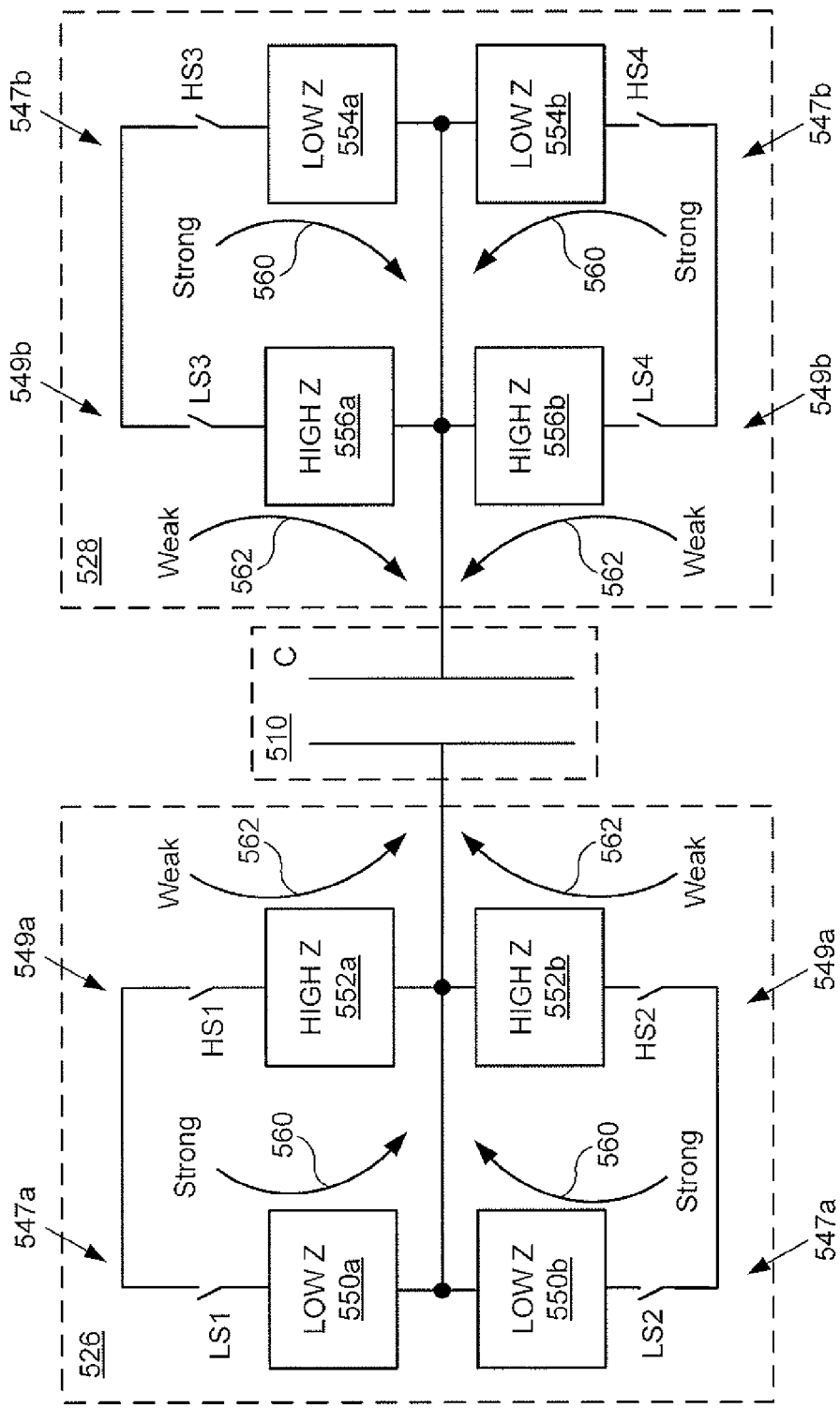
FIG. 5 presents exemplary variable impedance drivers, in accordance with implementations of the present disclosure.

FIG. 5 presents exemplary variable impedance drivers, in accordance with implementations of the present disclosure. In FIG. 5, variable impedance drivers 526 and 528 can correspond to variable impedance drivers 226a and 228a of FIG. 2 respectively and/or variable impedance drivers 226b and 228b of FIG. 2 respectively. Variable impedance drivers 526 and 528 are coupled to one another through isolation barrier 510, which can correspond to isolation barrier 210a and/or 210b in FIG. 2. For clarity of disclosure, variable impedance drivers 526 and 528 will be described below as corresponding to variable impedance drivers 226b and 228b of FIG. 2, but could similarly be described with respect to impedance drivers 226a and 228a. Furthermore, isolation barrier 510 will be described below as corresponding to isolation barrier 210b of FIG. 2, but could similarly be described with respect to isolation barrier 210a.

Low voltage circuit 206 is configured to adjust an impedance coupled to isolation barrier 210b so as to provide differential signal 230 to high voltage circuit 208 through isolation barrier 210b. This impedance can be adjusted by low voltage circuit 206 utilizing variable impedance driver 526 (variable impedance driver 226b). High voltage circuit 208 is configured to adjust an impedance coupled to isolation barrier 210b so as to provide feedback signal FB to low voltage circuit 206 through isolation barrier 210b. This impedance can be adjusted by high voltage circuit 208 utilizing variable impedance driver 528 (variable impedance driver 228b).

Variable impedance driver 526 includes low impedance driver 547a and high impedance driver 549a. Low impedance driver 547a includes a half-bridge having low impedance switches LS1 and LS2 configured to apply low impedances 550a and 550b to isolation barrier 210b. High impedance driver 549a includes a half-bridge having high impedance switches HS1 and HS2 configured to apply high impedances 552a and 552b to isolation barrier 210b.

Variable impedance driver 528 includes low impedance driver 547b and high impedance driver 549b. Low impedance driver 547b includes a half-bridge having low impedance switches LS3 and LS4 configured to apply low impedances 554a and 554b to isolation barrier 210b. High impedance driver 549b includes a half-bridge having high impedance switches HS3 and HS4 configured to apply high impedances 556a and 556b to isolation barrier 210b.

Low impedances 550a and 550b can provide lower impedance to isolation barrier 510 than high impedances 552a and 552b. Similarly, low impedances 554a and 554b can provide lower impedance to isolation barrier 510 than high impedances 556a and 556b. Thus, variable impedance driver 526 can be configured for strong signals 560 utilizing low impedance drivers 547a and 547b and can be configured for weak signals 562 utilizing high impedance drivers 549a and 549b. Strong signals 560 dominate signaling between variable impedance drivers 526 and 528 over weak signals 562. Variable impedance driver 526 can facilitate bidirectional signaling by selecting between low impedance drivers 547a and 547b and high impedance drivers 549a and 549b.

Low voltage circuit 206 is configured to adjust low impedances 550a and 550b and high impedances 552a and 552b of variable impedance driver 226b coupled to isolation barrier 210b so as to provide differential signal 230 to high voltage circuit 208 through isolation barrier 210b. More particularly, low voltage circuit 206 is configured to utilize low impedances 550a and 550b to transmit edges (e.g. falling edge 442a and rising edges 442b and 422c) of differential signal 230 through isolation barrier 210b and high impedances 552a and 552b between the edges (e.g. falling edge 442a and rising edges 442b and 422c) of differential signal 230. By utilizing low impedances 550a and 550b, low voltage circuit 206 can generate signal spikes, such as input signal spikes 448a and 448b in waveform 440c of FIG. 4. Those input signal spikes correspond to the edges of differential signal 230.

High voltage circuit 208 is similarly configured to adjust low impedances 554a and 554b and high impedances 556a and 556b of variable impedance driver 228b coupled to isolation barrier 210b so as to provide feedback signal FB to low voltage circuit 206 through isolation barrier 210b. Between signal spikes, such as input signal spikes 448a and 448b in waveform 440c of FIG. 4, high voltage circuit 208 can utilize high impedances 556a and 556b. By utilizing high impedances 556a and 556b, high voltage circuit 208 can provide feedback signal FB to low voltage circuit 206 via feedback FIFO. As input signal spikes 448a and 448b in waveform 440c correspond to edges in differential signal 230, high voltage circuit 208 is configured to provide feedback signal FB to low voltage circuit 206 between edges of differential signal 230 and low voltage circuit 206 is configured to receive feedback signal FB from high voltage circuit 208 between edges of differential signal 230.

During common mode noise in level shifter 202, common mode noise spikes 450a, 450b, 450c, and 450b, have rising slopes as shown in FIG. 4. However, once common mode noise subsides, common mode noise spikes 450a, 450b, 450c, and 450b discharge back to DC bias level to end distortion 452 in output signal HO. That discharge depends on impedance on isolation barrier 210b. In accordance with some implementations of the present disclosure, high voltage circuit 208 is configured to actively discharge isolation barrier 210b responsive to detecting common mode noise in level shifter 202. By doing so, common mode noise spikes 450a, 450b, 450c, and 450b can discharge rapidly as shown in FIG. 4 to significantly reduce distortion 452. For example, in the present implementation, high voltage circuit 208 is configured to switch from a high impedance (e.g. high impedance driver 549b) to a low impedance (e.g. low impedance driver 547b) to discharge isolation barrier 210b responsive to detecting common mode noise in level shifter 202. Low impedances 554a and 554b can thereby be utilized to rapidly discharge isolation barrier 210b. A similar approach may be utilized to rapidly discharge isolation barrier 210a.

Thus, as described above with respect to FIGS. 1, 2, 3A-3D, 4, and 5, various implementations of the present disclosure provide for level shifters having a low voltage circuit configured to provide a differential signal to a high voltage circuit through a capacitive isolation barrier where the high voltage circuit is configured to provide a feedback signal to the low voltage circuit through the capacitive isolation barrier. In some implementations, the aforementioned is accomplished utilizing low impedance and high impedance drivers in each of the low and high voltage circuits, but other approaches can be utilized.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A level shifter comprising:
a low voltage circuit and a high voltage circuit;
said low voltage circuit configured to provide a differential signal to said high voltage circuit through a capacitive isolation barrier;
said high voltage circuit configured to receive said differential signal from said low voltage circuit through said capacitive isolation barrier so as to level shift said differential signal from a first ground of said low voltage circuit to a second ground of said high voltage circuit;
wherein said high voltage circuit is configured to provide a feedback signal to said low voltage circuit through said capacitive isolation barrier.

2. The level shifter of claim 1, wherein said low voltage circuit is configured to receive said feedback signal from said high voltage circuit between rising and falling edges of said differential signal.

3. The level shifter of claim 1, wherein high voltage circuit is configured to adjust an impedance coupled to said capacitive isolation barrier so as to provide said feedback signal to said low voltage circuit through said capacitive isolation barrier.

4. The level shifter of claim 1, wherein said low voltage circuit is configured to adjust an impedance coupled to said capacitive isolation barrier so as to provide said differential signal to said high voltage circuit through said capacitive isolation barrier.

5. The level shifter of claim 1, wherein said low voltage circuit is configured to utilize a low impedance to transmit rising and falling edges of said differential signal through said capacitive isolation barrier and a high impedance between said rising and falling edges of said differential signal.

6. The level shifter of claim 1, wherein said high voltage circuit is configured to actively discharge said capacitive isolation barrier responsive to detecting common mode noise in said level shifter.

7. The level shifter of claim 1, wherein said feedback signal indicates common mode noise in said level shifter.

8. The level shifter of claim 1, wherein said low voltage circuit is configured to refresh said differential signal responsive to said feedback signal.

9. A high voltage circuit of a level shifter, said high voltage circuit being configured to:
receive a differential signal from a low voltage circuit through a capacitive isolation barrier so as to level shift said differential signal from a first ground of said low voltage circuit to a second ground of said high voltage circuit;
provide a feedback signal from said high voltage circuit to said low voltage circuit through said capacitive isolation barrier.

10. The level shifter of claim 9, wherein said high voltage circuit is configured to provide said feedback signal to said low voltage circuit between rising and falling edges of said differential signal.

11. The level shifter of claim 9, wherein high voltage circuit is configured to adjust an impedance coupled to said capacitive isolation barrier so as to provide said feedback signal to said low voltage circuit through said capacitive isolation barrier.

12. The level shifter of claim 9, wherein high voltage circuit is configured to switch from a high impedance to a low impedance to discharge said capacitive isolation barrier responsive to detecting common mode noise in said level shifter.

13. The level shifter of claim 9, wherein said feedback signal indicates common mode noise in said level shifter.

14. The level shifter of claim 9, wherein high voltage circuit is configured to detect common mode noise in said level shifter.

15. The level shifter of claim 9, wherein said high voltage circuit is configured to provide said feedback signal to said low voltage circuit from an input of said high voltage circuit.

16. A low voltage circuit of a level shifter, said low voltage circuit being configured to:
provide a differential signal to a high voltage circuit through a capacitive isolation barrier so as to level shift said differential signal from a first ground of said low voltage circuit to a second ground of said high voltage circuit;
wherein said low voltage circuit is configured to receive a feedback signal from said high voltage circuit through said capacitive isolation barrier.

17. The low voltage circuit of claim 16, wherein said low voltage circuit is configured to receive said feedback signal from said high voltage circuit between rising and falling edges of said differential signal.

18. The low voltage circuit of claim 16, wherein said low voltage circuit is configured to utilize a low impedance to transmit rising and falling edges of said differential signal through said capacitive isolation barrier and a high impedance between said rising and falling edges of said differential signal.

19. The low voltage circuit of claim 16, wherein said low voltage circuit is configured to provide said feedback signal as an output of said level shifter.

20. The low voltage circuit of claim 16, wherein said low voltage circuit is configured to refresh said differential signal responsive to said feedback signal.

* * * * *